(12) United States Patent
White et al.

(10) Patent No.: US 6,517,303 B1
(45) Date of Patent: Feb. 11, 2003

(54) SUBSTRATE TRANSFER SHUTTLE

(75) Inventors: John M. White, Hayward, CA (US); Norman L. Turner, Vero Beach, FL (US); Robin L. Tiner, Santa Cruz, CA (US); Ernst Keller, Sunnyvale, CA (US); Shinichi Kurita, San Jose, CA (US); Wendell T. Blonigan, Union City, CA (US); David E. Berkstresser, Los Gatos, CA (US)

(73) Assignee: Applied Komatsu Technology, Inc., Tokyo (JP)

( * ) Notice: Subject to any disclaimer, the term of this patent is extended or adjusted under 35 U.S.C. 154(b) by 0 days.

(21) Appl. No.: 09/082,484

(22) Filed: May 20, 1998

(51) Int. Cl.[7] ................................................. B65G 1/33
(52) U.S. Cl. ...................................... 414/217; 414/939
(58) Field of Search .............................. 414/217, 217.1, 414/939, 941

(56) References Cited

U.S. PATENT DOCUMENTS 3,850,105 A   11/1974   Aronstein et al. ........... 104/1 R (List continued on next page.)

FOREIGN PATENT DOCUMENTS

| DE | 2114470 | 9/1972 | |
|----|---------|--------|--|
| DE | 3941110 A1 | 6/1990 | |
| EP | 0 359 525 A2 | 3/1990 | |
| EP | 0 608 633 A2 | 8/1994 | |
| EP | 0 684 630 A2 | 11/1995 | |
| EP | 0 756 316 A1 | 1/1997 | |
| EP | 0 608 633 B1 | 3/1999 | |
| GB | 2171 119 A | 8/1986 | |
| GB | 2284 105 A | 5/1995 | |
| JP | 61-117278 | 6/1986 | |
| JP | 63-141342 | 6/1988 | |
| JP | 3-136345 | 6/1991 | |
| JP | 4-164718 | 6/1992 | |
| JP | 59-53320 | 3/1994 | |
| JP | 8-274142 | 10/1996 | |
| JP | 09 223727 | 11/1996 | ........... H01L/21/68 |
| WO | WO 94/00868 | 1/1994 | |
| WO | WO 98/02911 | 1/1998 | ........... H01L/21/00 |

OTHER PUBLICATIONS

IBM Technical Disclosure Bulletin, vol. 17, No. 8, p. 2268–9, Jan. 1975, Y. Budo, R.D. Dreyer, A.C. Key, J.E. Kulak, B.E. MacKennie.

PCT International Search Report on Ser. No. PCT/US 99/11060, dated May 13, 1999.

PCT International Search Report on Ser. No. PCT/IB 99/10395, Sep. 29, 1999, 8 pages.

PCT International Search Report on Ser. No. PCT/US 99/10687, Oct. 11, 1999.

PCT International Search Report PCT/IB 99/01431 Dated Jul. 28, 2000.

Primary Examiner—Gregory A. Morse
(74) Attorney, Agent, or Firm—Thomason, Moser & Patterson, L.L.P.

(57) ABSTRACT

The present invention provides an apparatus and method for substrate transport. In systems according to the invention, at least a first and second chamber are provided. The first chamber may be a load lock and the second chamber a processing chamber. A substrate transfer shuttle is provided and is moveable along a linear path defined by guide rollers between one position in the first chamber and another position in the second chamber. In this way, the substrate may be transferred, in both a forward and a reverse direction, between the first chamber and the second chamber. The substrate transfer shuttle is structured so that a substrate may be removed therefrom by moving a support in one of the chambers from a lowered position to an intermediate position, after which the substrate transfer shuttle may be removed from the chamber.

38 Claims, 11 Drawing Sheets

U.S. PATENT DOCUMENTS

| | | | |
|---|---|---|---|
| 3,973,665 A | 8/1976 | Giammanco | 198/19 |
| 3,976,330 A | 8/1976 | Babinski et al. | 302/2 R |
| 4,047,624 A | 9/1977 | Dorenbos | |
| 4,166,563 A | 9/1979 | Peyraud et al. | 228/47 |
| 4,649,830 A | 3/1987 | Tanaka | 104/138.1 |
| 4,682,927 A | 7/1987 | Southworth et al. | 414/217 |
| 4,749,465 A | 6/1988 | Flint et al. | 204/298 |
| 4,775,281 A | 10/1988 | Prentakis | 414/416 |
| 4,829,445 A | 5/1989 | Burney | 364/478 |
| 4,846,102 A | 7/1989 | Ozias | 118/730 |
| 4,857,689 A | 8/1989 | Lee | 219/10.71 |
| 4,870,923 A | 10/1989 | Sugimoto | 118/715 |
| 4,913,929 A | 4/1990 | Moslehi et al. | 427/39 |
| 4,951,601 A | 8/1990 | Maydan et al. | 118/719 |
| 4,985,722 A | 1/1991 | Ushijima et al. | 354/319 |
| 4,989,543 A | 2/1991 | Schmitt | 118/723 |
| 5,001,327 A | 3/1991 | Hirasawa et al. | 219/390 |
| 5,060,354 A | 10/1991 | Chizinsky | 29/25.02 |
| 5,064,337 A | 11/1991 | Asakawa et al. | 414/639 |
| 5,086,729 A | 2/1992 | Katagiri | 118/729 |
| 5,110,249 A | 5/1992 | Norman | 414/217 |
| 5,170,714 A | 12/1992 | Katagiri | 104/282 |
| 5,178,638 A | 1/1993 | Kaneko et al. | 29/25.01 |
| 5,187,115 A | 2/1993 | Coleman | 437/101 |
| 5,203,443 A | 4/1993 | Toriumi et al. | 198/341 |
| 5,227,708 A | 7/1993 | Lowrance | 318/640 |
| 5,252,807 A | 10/1993 | Chizinsky | 219/390 |
| 5,259,883 A | 11/1993 | Yamabe et al. | 118/725 |
| 5,275,709 A | 1/1994 | Anderle et al. | 204/298.25 |
| 5,288,379 A | 2/1994 | Namiki et al. | 204/192.12 |
| 5,292,393 A | 3/1994 | Maydan et al. | 156/345 |
| 5,352,294 A | 10/1994 | White et al. | 118/725 |
| 5,355,066 A | 10/1994 | Lowrance | 318/640 |
| 5,377,816 A | 1/1995 | Deligi et al. | 198/619 |
| 5,382,126 A | 1/1995 | Hartig et al. | 414/217 |
| 5,425,611 A | 6/1995 | Hughes et al. | 414/217 |
| 5,447,409 A | 9/1995 | Grunes et al. | 414/744.6 |
| 5,469,035 A | 11/1995 | Lowrance | 318/568.1 |
| 5,470,784 A | 11/1995 | Coleman | 437/101 |
| 5,512,320 A | 4/1996 | Turner et al. | 427/255 |
| 5,535,306 A | 7/1996 | Stevens | 395/89 |
| 5,536,128 A | 7/1996 | Shimoyashiro et al. | 414/273 |
| 5,537,311 A | 7/1996 | Stevens | 364/167.01 |
| 5,571,325 A | 11/1996 | Ueyama et al. | 118/320 |
| 5,607,009 A | 3/1997 | Turner et al. | 165/48 |
| 5,611,865 A | 3/1997 | White et al. | 118/725 |
| 5,674,786 A | 10/1997 | Turner et al. | 437/225 |
| 5,700,127 A * | 12/1997 | Harada et al. | 414/939 |
| 5,701,627 A | 12/1997 | Matsumura et al. | 15/88.2 |
| 5,846,328 A | 12/1998 | Aruga et al. | 118/718 |
| 5,879,128 A * | 3/1999 | Tietz et al. | 414/939 |
| 5,881,649 A | 3/1999 | Hasegawa et al. | 104/167 |
| 5,883,017 A * | 3/1999 | Tepman et al. | 414/939 |
| 5,976,199 A | 11/1999 | Wu et al. | 29/25.01 |
| 6,013,134 A * | 1/2000 | Chu et al. | 414/939 |

\* cited by examiner

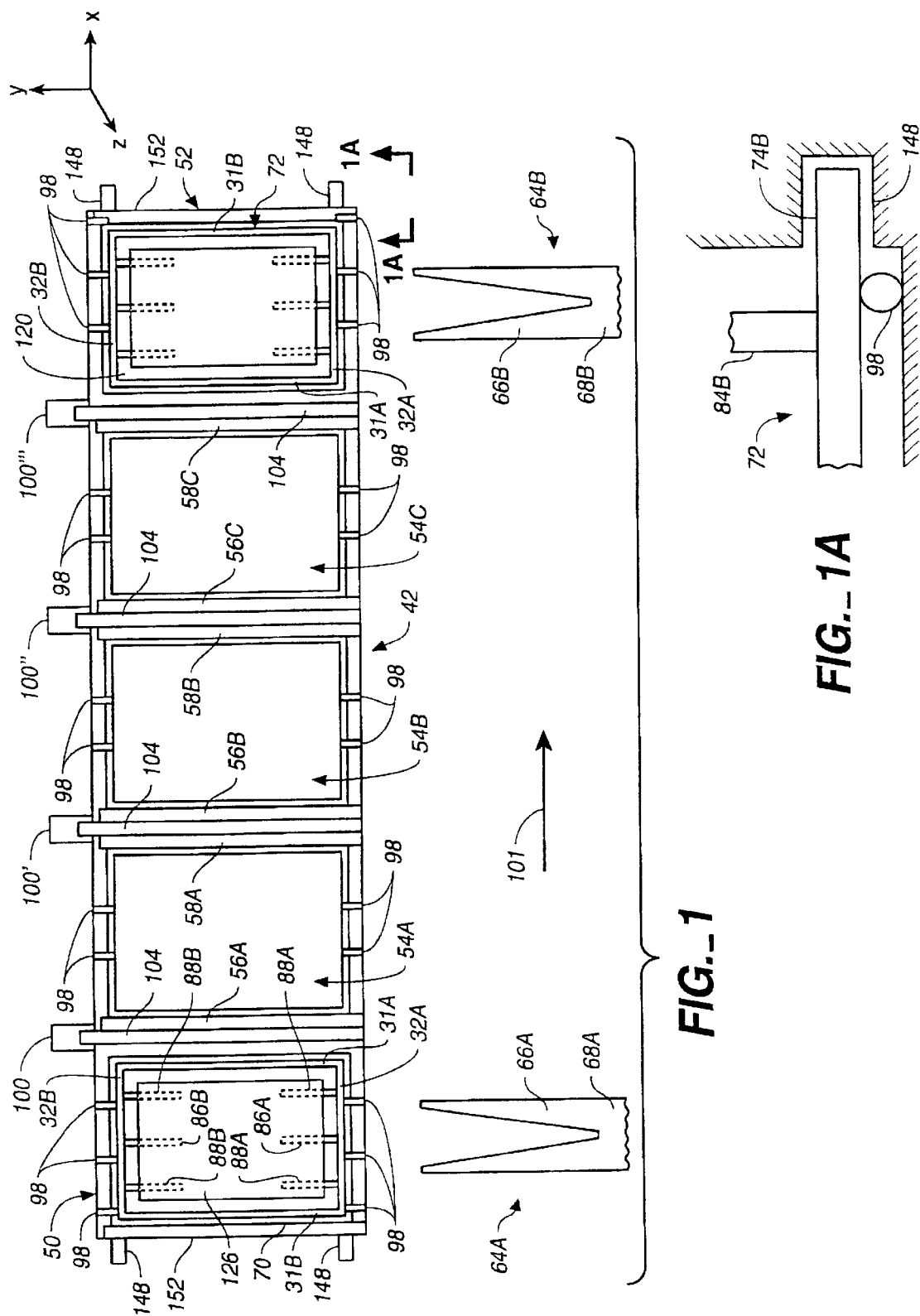

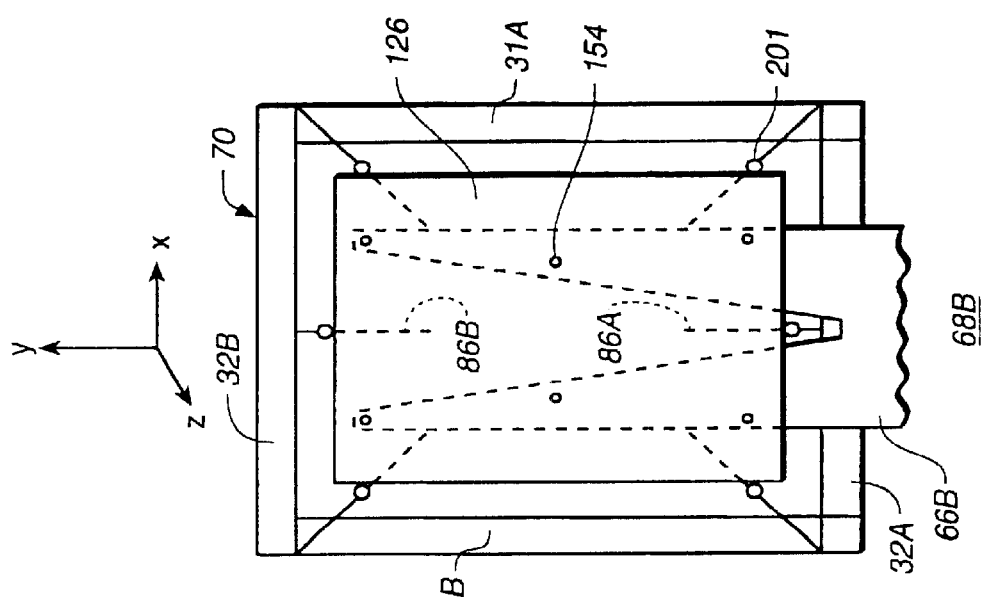
*FIG._2C*
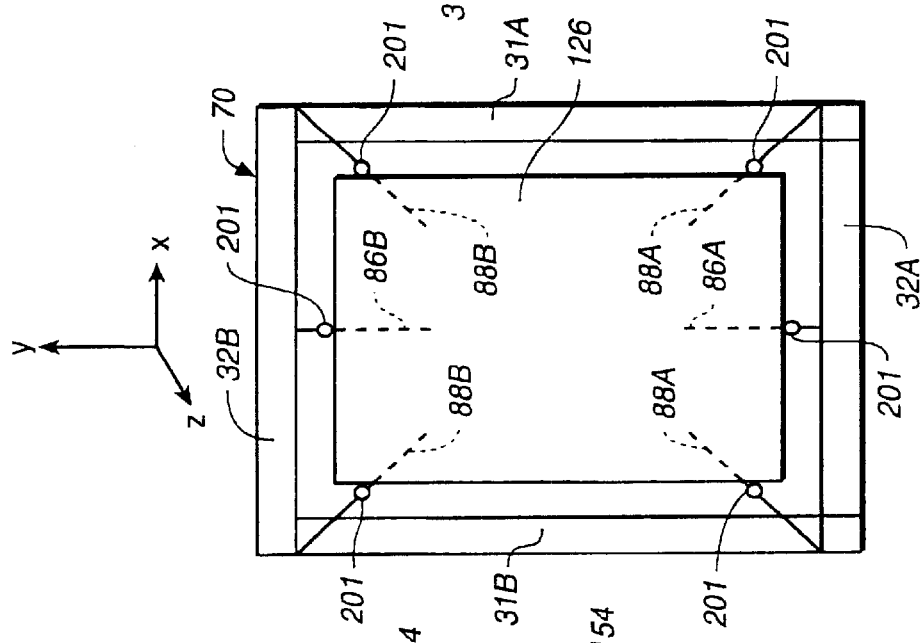
*FIG._2B*
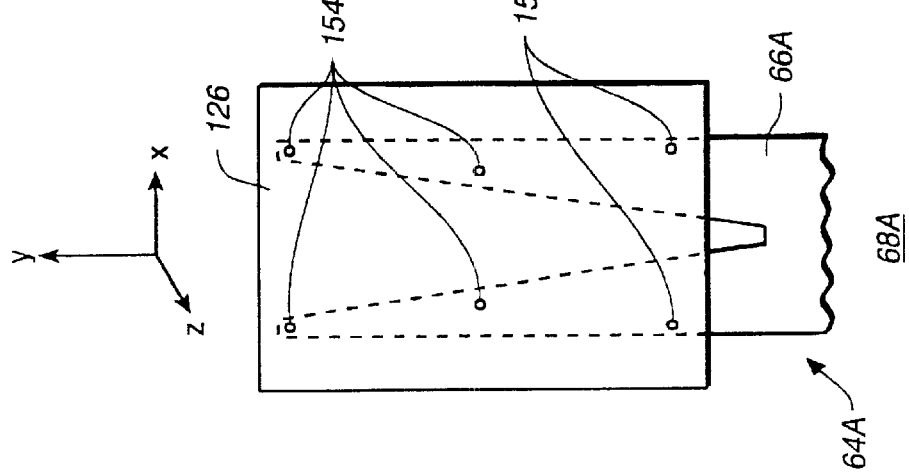
*FIG._2A*

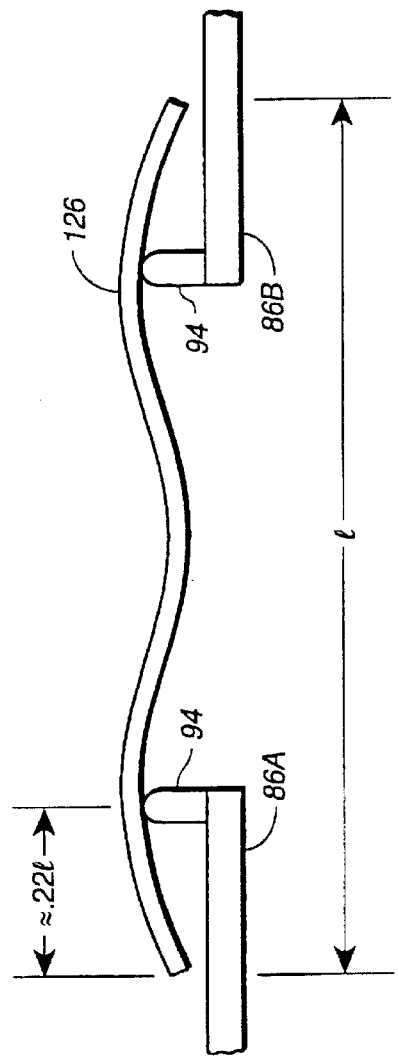
FIG._2D
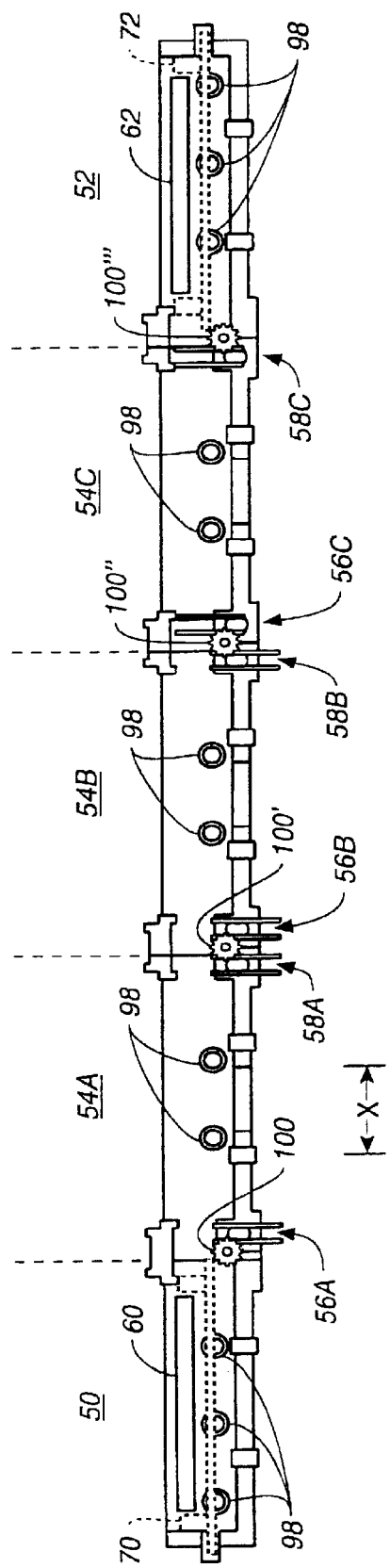
FIG._3

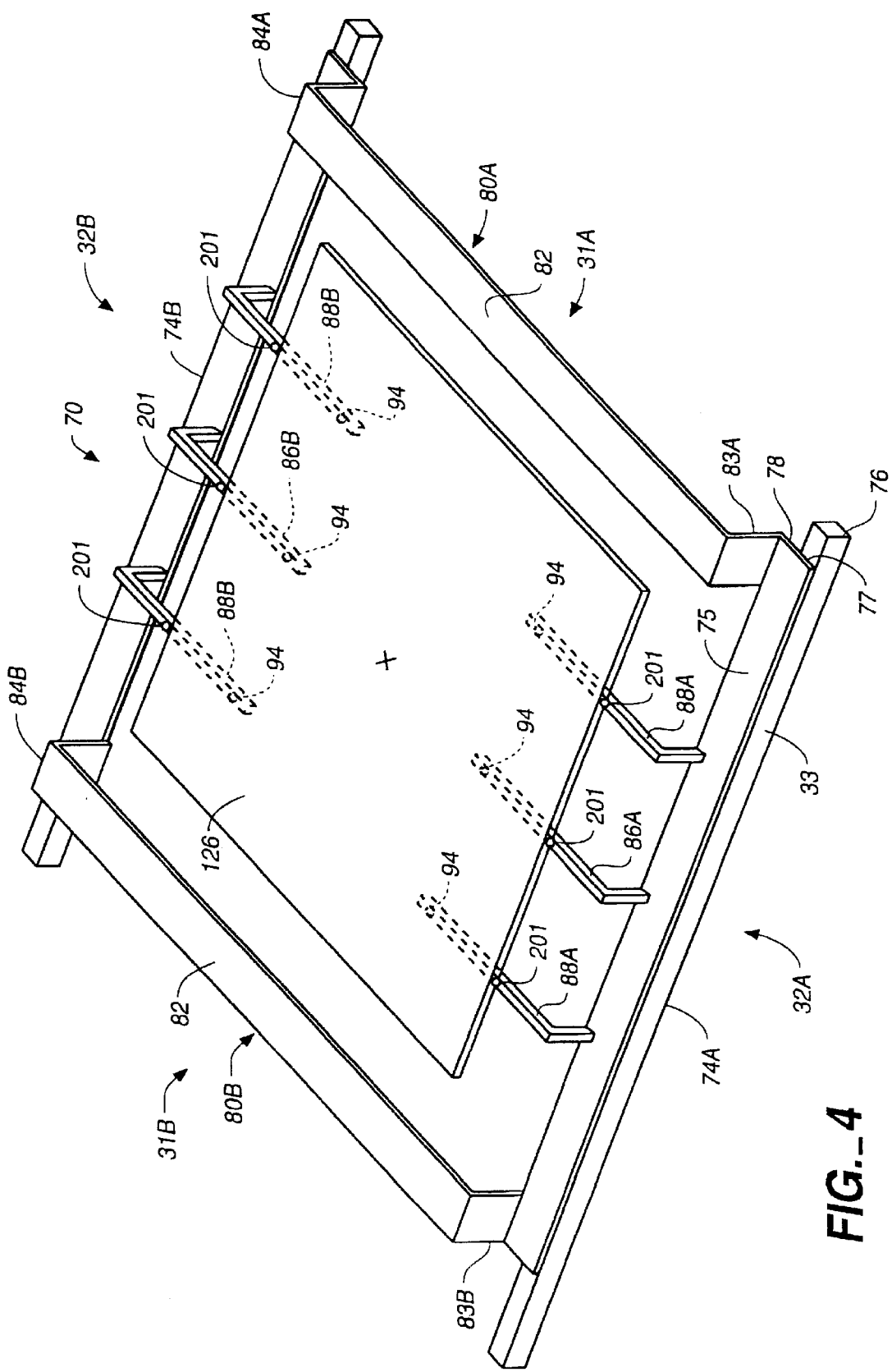
FIG._4

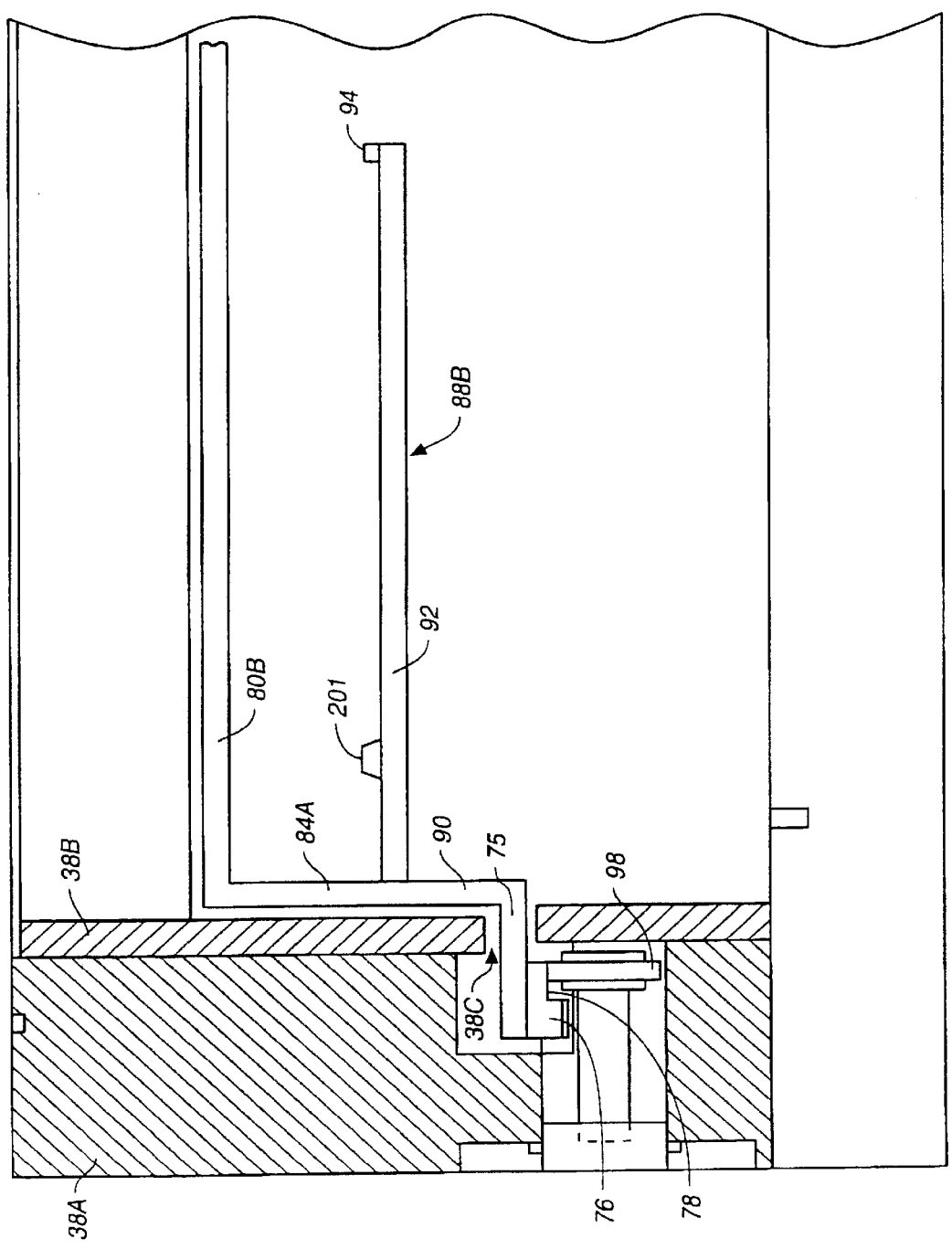
FIG._5

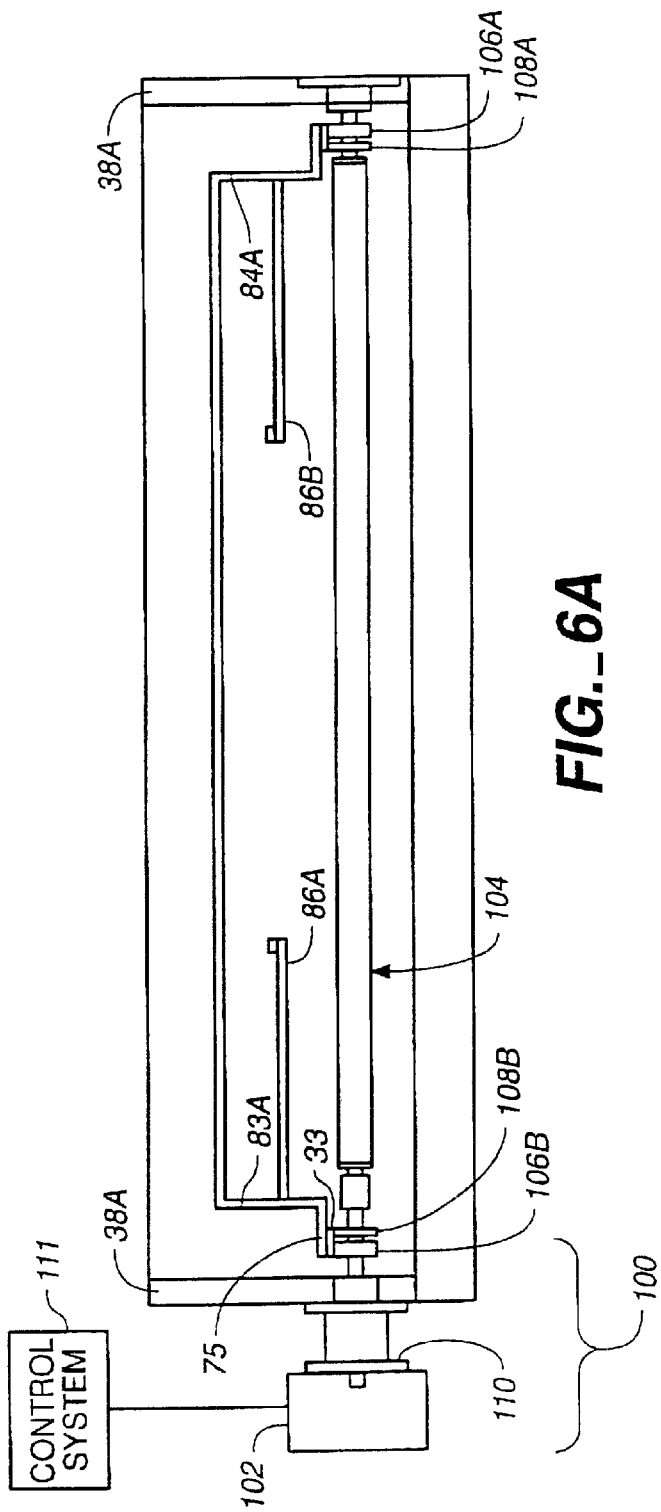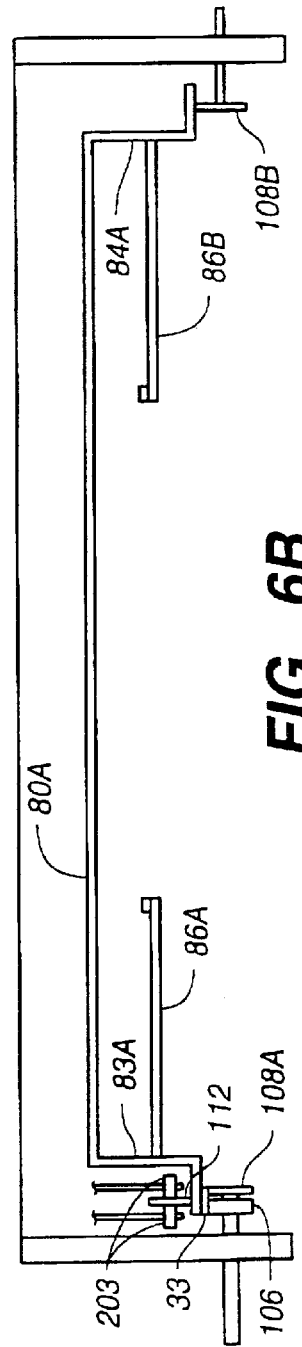

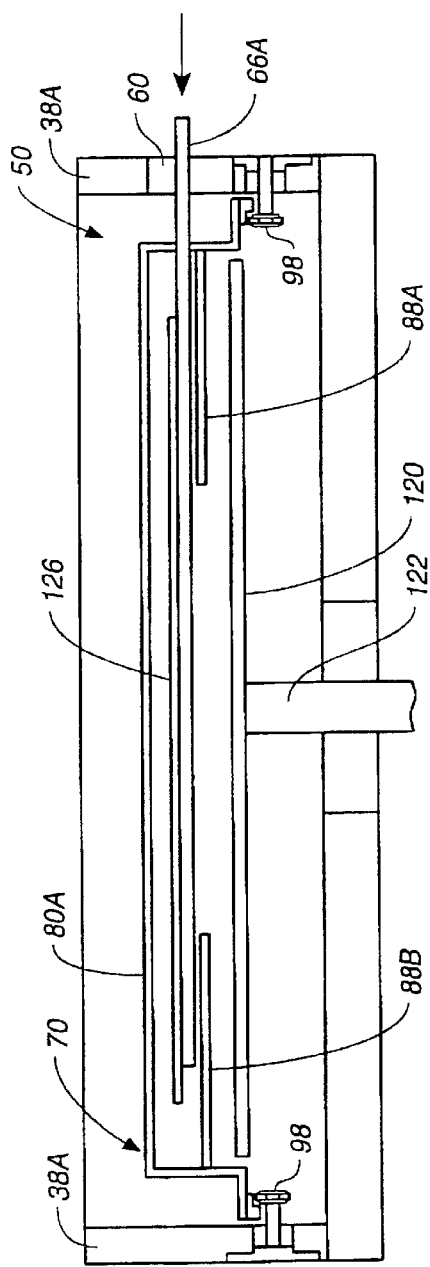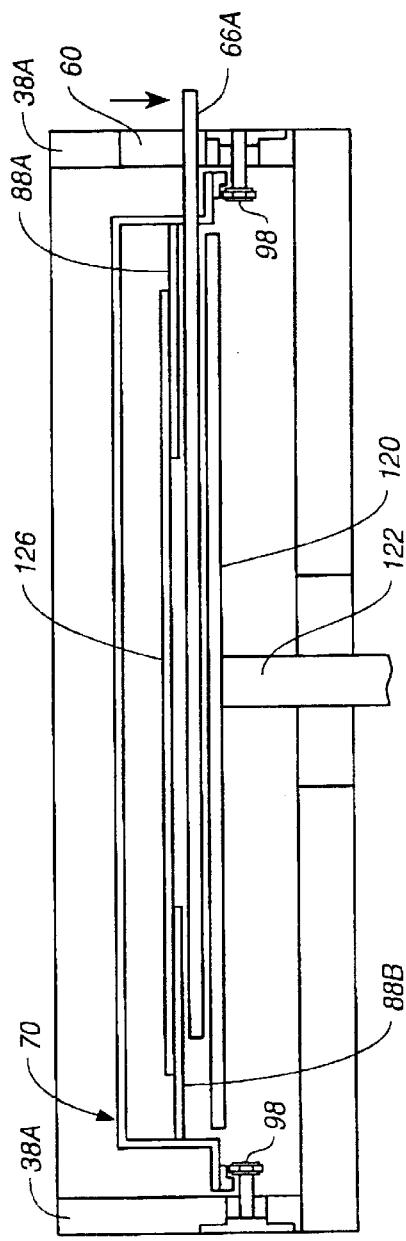

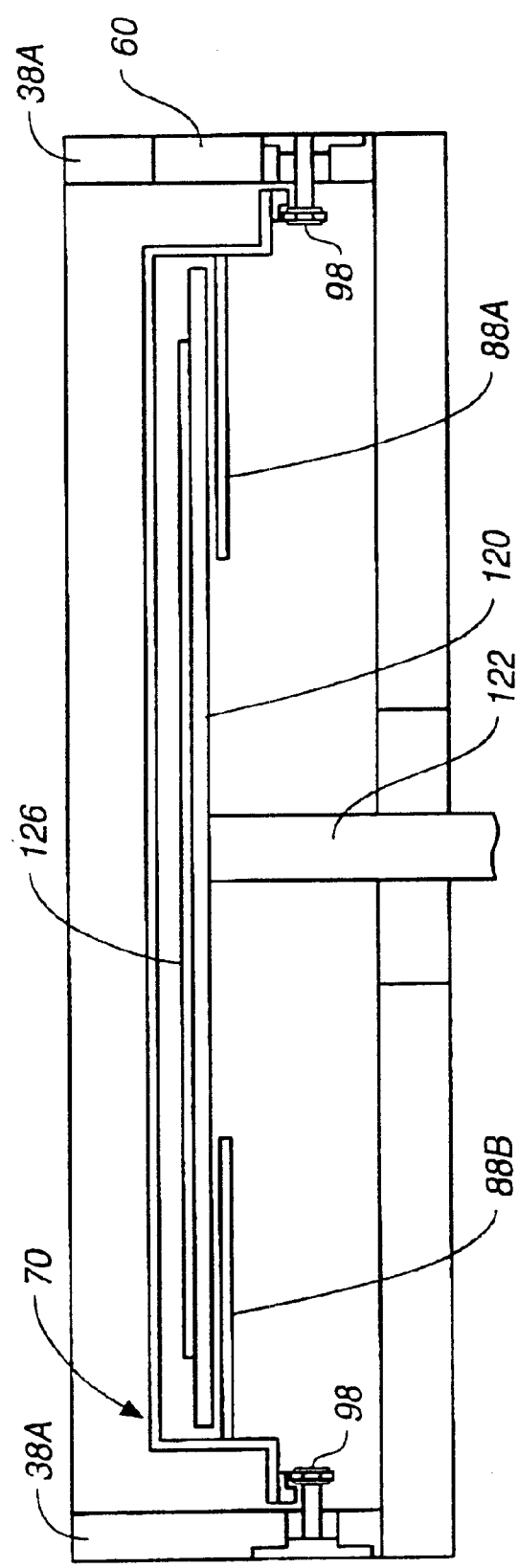
FIG._7C

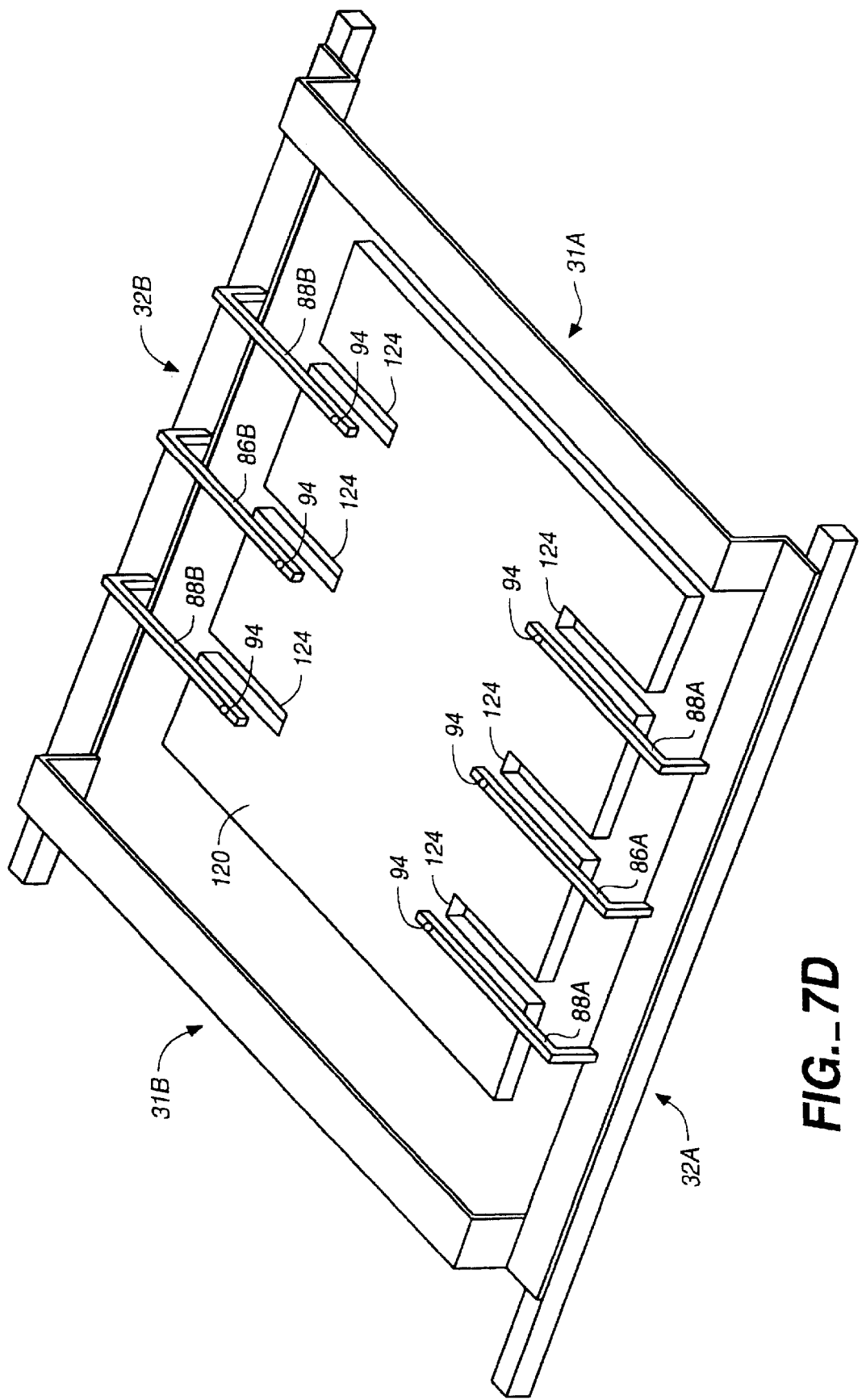
FIG._7D

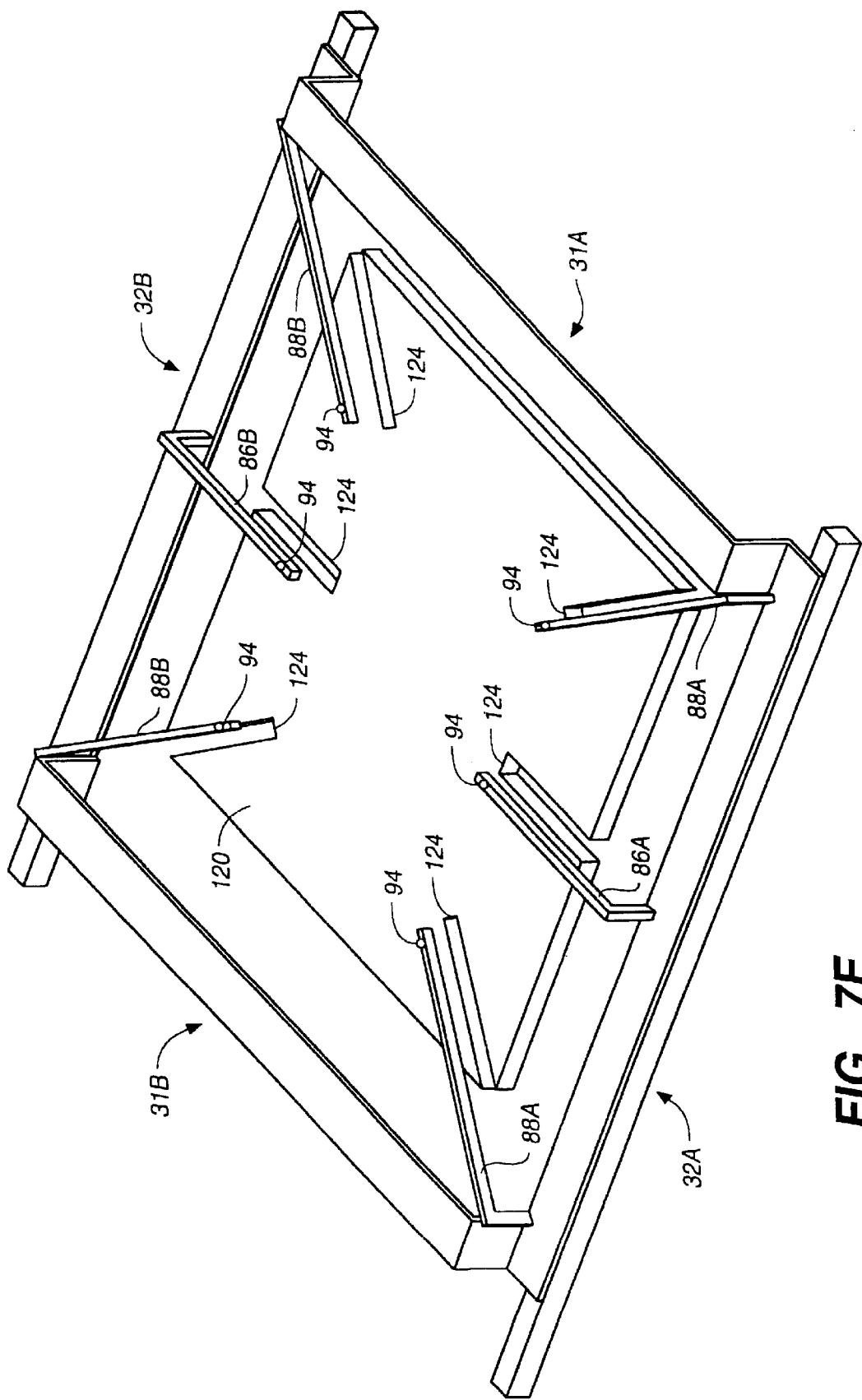
FIG._7E

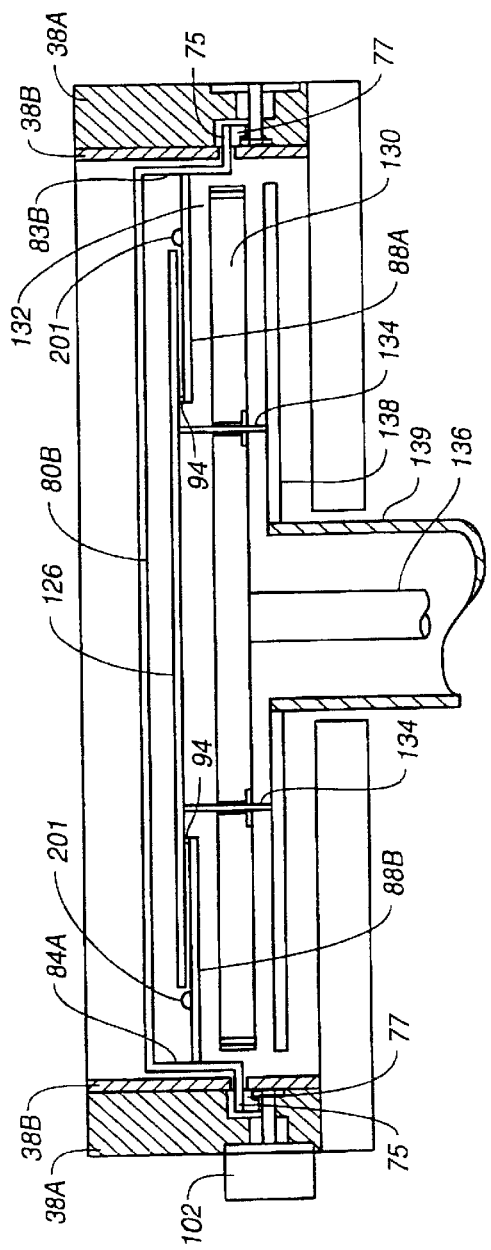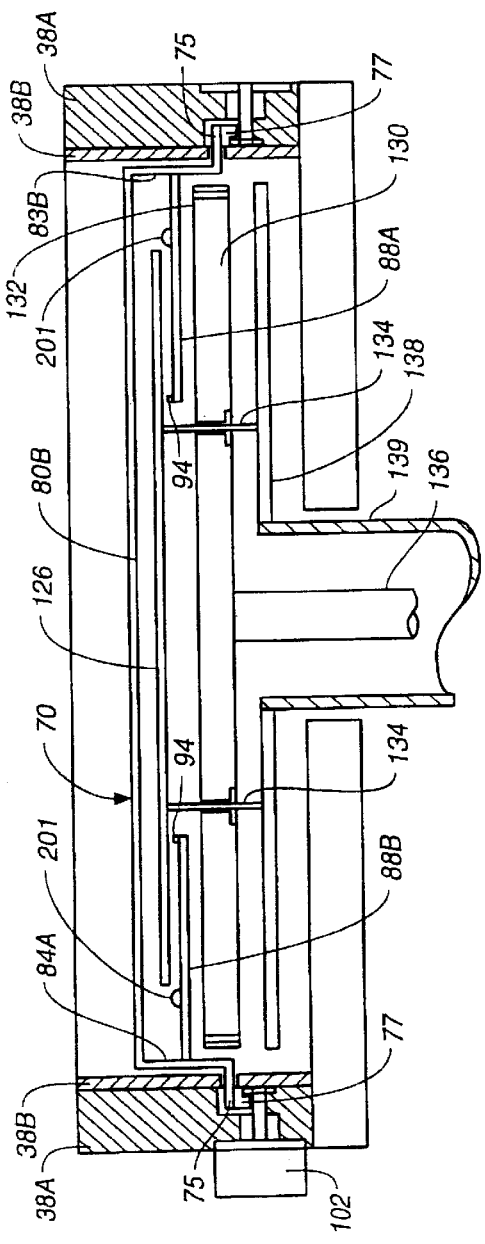

SUBSTRATE TRANSFER SHUTTLE

RELATED APPLICATIONS

The present application is related to U.S. patent application Ser. No. 08/946,922, entitled "MODULAR CLUSTER PROCESSING SYSTEM," filed Oct. 8, 1997, now abandoned. The present application is also related to the following U.S. patent applications which are being filed concurrently with this application: (1) "Method and Apparatus for Substrate Transfer and Processing," U.S. Ser. No. 09/082,428, filed on May 20, 1998; (2) "Multi-Function Chamber For A Substrate Processing System," now U.S. Pat. No. 6,086,362, issued on Jul. 11, 2000; (3) "An Automated Substrate Processing System," U.S. Ser. No. 09/082,413, filed on May 20, 1998; (4) "Substrate Transfer Shuttle Having a Magnetic Drive," U.S. Ser. No. 09/082,605, filed on May 20, 1998 and; (5) "In-Situ Substrate Transfer Shuttle," U.S. Ser. No. 09/082,488, filed on May 20, 1998.

The foregoing patent applications, which are assigned to the assignee of the present application, are incorporated herein by reference.

BACKGROUND

The invention relates to substrate processing, and more particularly to transferring substrates to and from processing chambers.

Glass substrates are being used for applications such as active matrix televisions and computer displays, among others. A large glass substrate can form multiple display monitors, each of which may contain more than a million thin film transistors.

The processing of large glass substrates often involves the performance of multiple sequential steps, including, for example, the performance of chemical vapor deposition (CVD) processes, physical vapor deposition (PVD) processes, or etch processes. Systems for processing glass substrates can include one or more process chambers for performing those processes.

The glass substrates can have dimensions, for example, of 550 mm by 650 mm. The trend is toward even larger substrate sizes, such as 650 mm by 830 mm and larger, to allow more displays to be formed on the substrate or to allow larger displays to be produced. The larger sizes place even greater demands on the capabilities of the processing systems.

Some of the basic processing techniques for depositing thin films on the large glass substrates are generally similar to those used, for example, in the processing of semiconductor wafers. Despite some of the similarities, however, a number of difficulties have been encountered in the processing of large glass substrates that cannot be overcome in a practical way and cost effectively by using techniques currently employed for semiconductor wafers and smaller glass substrates.

For example, efficient production line processing requires rapid movement of the glass substrates from one work station to another, and between vacuum environments and atmospheric environments. The large size and shape of the glass substrates makes it difficult to transfer them from one position in the processing system to another. As a result, cluster tools suitable for vacuum processing of semiconductor wafers and smaller glass substrates, such as substrates up to 550 mm by 650 mm, are not well suited for the similar processing of larger glass substrates, such as 650 mm by 830 mm and above. Moreover, cluster tools require a relatively large floor space.

One way to improve such processing tools is disclosed in U.S. patent application Ser. No. 08/946,922, entitled "MODULAR CLUSTER PROCESSING SYSTEM," assigned to Applied Komatsu Technologies, Inc. of Santa Clara, Calif., and incorporated above by reference. The use of a modular processing system is disclosed, with substrate movement exterior of processing islands performed by conveyors or robots on tracks. Substrate movement interior of processing islands is performed by a substrate transporter. In this type of system, the transporter may move a substrate into or out of a processing chamber, after which the transporter may stay resident in either load lock.

Similarly, chamber configurations designed for the processing of relatively small semiconductor wafers are not particularly suited for the processing of these larger glass substrates. The chambers must include apertures of sufficient size to permit the large substrates to enter or exit the chamber. Moreover, processing substrates in the process chambers typically must be performed in a vacuum or under low pressure. Movement of glass substrates between processing chambers, thus, requires the use of valve mechanisms which are capable of closing the especially wide apertures to provide vacuum-tight seals and which also must minimize contamination.

Furthermore, relatively few defects can cause an entire monitor formed on the substrate to be rejected. Therefore, reducing the occurrence of defects in the glass substrate when it is transferred from one position to another is critical. Similarly, misalignment of the substrate as it is transferred and positioned within the processing system can cause the process uniformity to be compromised to the extent that one edge of the glass substrate is electrically non-functional once the glass has been formed into a display. If the misalignment is severe enough, it even may cause the substrate to strike structures and break inside the vacuum chamber.

Other problems associated with the processing of large glass substrates arise due to their unique thermal properties. For example, the relatively low thermal conductivity of glass makes it more difficult to heat or cool the substrate uniformly. In particular, thermal losses near the edges of any large-area, thin substrate tend to be greater than near the center of the substrate, resulting in a non-uniform temperature gradient across the substrate. The thermal properties of the glass substrate combined with its size, therefore, makes it more difficult to obtain uniform characteristics for the electronic components formed on different portions of the surface of a processed substrate. Moreover, heating or cooling the substrates quickly and uniformly is more difficult as a consequence of its poor thermal conductivity, thereby reducing the ability of the system to achieve a high throughput.

As noted above, efficient production line processing requires rapid movement of the glass substrates from one work station to another. Other requirements include a structure that can firmly support the glass substrate during transfer and that can transport the glass substrate to all areas of a work station or processing island.

SUMMARY

The present invention allows large glass substrates to be moved within a processing station and from one processing station to another. In systems according to the invention, at least a first and second chamber are provided. Typically, the first chamber is a load lock and the second chamber is a processing chamber. The processing chamber may serve as an inspection station, a CVD chamber, a PECVD chamber, a PVD chamber, a post-anneal chamber, a cleaning chamber, a descumming chamber, an etch chamber, or a combination of such chambers. The load lock may be employed to heat or cool the substrate. Two load locks may be employed, one to perform heating and the other to perform cooling. The load locks each include a platen for supporting the substrate.

A substrate transfer shuttle is used to move substrate along a guide path defined by, e.g., guide rollers.

The substrate transfer shuttle is moveable along a linear path defined by guide rollers between one position in the first chamber and another position in the second chamber. In this way, the substrate may be transferred, in both a forward and a reverse direction, between the first chamber and the second chamber. The substrate transfer shuttle is structured so that a substrate may be removed therefrom by moving the platen from a lowered position to an intermediate position, after which the substrate transfer shuttle may be removed from the processing chamber. The substrate transfer shuttle includes first and second longitudinal side rails at respective first and second sides thereof. The shuttle also includes first and second pluralities of substrate support elements extending inwardly from the first longitudinal side rail and positioned to pass below the substrate when the substrate transfer shuttle is removed from the processing chamber. The substrate support elements extend about 15–30% of a dimension of the substrate, and more particularly about 22% of the width of the substrate. Drive mechanisms are employed that engage with at least the first longitudinal side rail to move the substrate transfer shuttle along at least portions of the shuttle path.

Implementations of the invention may include one or more of the following. A valve may be employed to selectively seal the first chamber from the second chamber when closed and to permit transfer of the substrate between the first chamber and the second chamber through the valve when open. Multiple shuttles may be employed for convenience in a particular process. Further, multiple intermediate chambers may be located between the first and second chambers.

The susceptor in the processing chamber includes a plurality of lift pins which are movable through holes in the susceptor and which support the substrate above the susceptor.

Steps of the method include positioning a substrate onto a substrate transfer shuttle in a load lock, and moving the substrate transfer shuttle from the load lock into a processing chamber along a first portion of a path. The substrate is removed from the substrate transfer shuttle and positioned it on a platen in the processing chamber. The substrate transfer shuttle is then removed from the processing chamber and the substrate is processed. Following processing, the substrate transfer shuttle is moved into the processing chamber and the substrate is positioned thereon. The substrate transfer shuttle and the substrate are moved into the load lock, and the substrate is removed from the substrate transfer shuttle.

Advantages of the invention include one or more of the following. The invention eliminates unnecessary substrate movement in a semiconductor processing system. For example, the substrate may be transferred horizontally except for loading and unloading on the susceptor. The invention also eliminates more expensive and cumbersome vacuum robots and transfer chamber systems. The invention allows removal of a substrate transfer shuttle during processing, reducing contamination.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

FIG. 1 is a top plan schematic view of a processing island of a system according to the present invention.

FIG. 1A is a side schematic view of a section of a load lock emptying alcoves.

FIGS. 2A–2C are top plan views of a shuttle and lifting fork according to the present invention.

FIG. 2D is a side view showing a heated bowing glass substrate supported on support fingers.

FIG. 3 is a side schematic view of a processing island of a system according to the present invention.

FIG. 4 is a perspective view of a substrate transfer shuttle according to the present invention.

FIG. 5 is a partial cross-sectional view of a processing chamber and substrate transfer shuttle according to the present invention.

FIG. 6A is a transverse cross-sectional view of a processing island and shuttle according to an embodiment of the present invention.

FIG. 6B is a transverse cross-sectional view of a processing island and shuttle according to an alternative embodiment of the present invention.

FIGS. 7A–7C are partial schematic cross-sectional views of a load lock chamber according to the present invention, showing a substrate in various stages of transfer from without to within a load lock chamber.

FIGS. 7D and 7E are perspective views of alternative embodiments of a substrate transfer shuttle and a platen as may be located in a load lock chamber.

FIGS. 8A–8B are schematic cross-sectional views of a chamber according to the present invention, shown in different stages of transfer of a substrate between a shuttle and a susceptor in a processing chamber.

Like reference numbers and designations in the various drawings indicate like elements.

DETAILED DESCRIPTION

FIG. 1 shows a processing island 42 of a fabrication system according to an embodiment of the present invention. Arrow 101 defines a direction pointing from "upstream" to "downstream" in the processing island. The island 42 includes a substrate heating load lock chamber 50 at a first end of the island and a substrate cooling load lock chamber 52 at a second end of the island, longitudinally opposite and downstream of the first end. Of course, the terms "heating" and "cooling" are not intended to be limiting. Rather, they are descriptive of exemplary features such chambers may possess.

Between the load lock chambers 50 and 52 are a plurality of processing chambers 54A–54C, which are connected in series between the load lock chambers. Each processing chamber 54A–54C includes first and second gate valves 56A–56C and 58A–58C, respectively, at the first and second ends of each processing chamber (see also FIG. 3). The valve 56A selectively seals the load lock chamber 50 from the processing chamber 54A when closed and permits transfer of substrates through the valve between the load lock chamber 50 and the processing chamber 54A when open. Similarly, the valve 58C selectively seals the load lock chamber 52 from the processing chamber 54C in a closed condition and permits the transfer of substrates through the valve in an open condition. The valves 58A and 56B seal the first processing chamber 54A from the second processing chamber 54B when closed and permit the transfer of substrates through the valves when open. Likewise, the valves 58B and 56C selectively seal the second processing chamber 54B from the third processing chamber 54C in closed conditions and permit the transfer of substrates through the valves in open conditions. The pairs of valves 58A, 56B and 58B, 56C may be replaced with single valves although the illustrated configuration has advantages described below. An example of the type of valve which may be employed is described in above-mentioned U.S. patent application entitled "Isolation Valves", U.S. Ser. No. 09/082,376, filed on May 20, 1998, and incorporated by reference above.

This detailed description describes an embodiment in which a glass substrate is used. The term "substrate" is intended to broadly cover any object that is being processed in a process chamber, including flat panel displays, glass or ceramic plates, plastic sheets, or disks. The present invention is particularly applicable to large substrates such as glass plates having dimensions of 650 mm by 830 mm or even larger.

In this system, the substrate is supported by support fingers. The support fingers may all be parallel, as shown in the embodiment of FIGS. 1, 4 and 7D, or some may be angled as shown in the preferred embodiment of FIGS. 2B–2C and 7E. In the described embodiments, the short dimension of the substrate is generally parallel to the direction of movement within a processing island.

FIGS. 1 and 3 show a substrate transfer shuttle in each of the load locks 50 and 52. As shown in FIG. 3, the load lock chambers 50 and 52 have respective gate or slit valves 60 and 62 positioned along one side of the island. The valves 60 and 62 (FIG. 3) selectively seal their associated load lock chambers from atmosphere in closed conditions and allow introduction or removal of substrates to or from the load lock chambers in open conditions. In this figure, valves 56A, 58A, 56B and 58B are shown open, and valves 56C and 58C are shown closed.

The substrates may be introduced through the valve 60 to the load lock chamber 50 which forms an entrance load lock chamber. With the load lock chamber 50 in a condition sealed from the atmosphere and process chamber 54A, the load lock chamber may be pumped to vacuum and the substrate heated.

The load lock system allows a staged vacuum to occur. That is, the process chamber vacuum need not be breached for substrates to be loaded and unloaded. Since the load locks are independently pumped-down prior to the opening of the valves separating them from the process chambers, the process chamber pumps need only evacuate a chamber that is already partially at vacuum. That is, they need only maintain process vacuum conditions. Such a capability is particularly important for, e.g., physical vapor deposition (PVD), which may often require the lowest pressure of any process.

Each load lock chamber may be multifunctional. Process steps such as heating, cooling, and descumming may be provided for in each load lock. Heating and cooling may be provided for by heating and cooling plates which may be moved into and out of thermal contact with the substrate. Typically, the load lock 50 may be used to heat and descum, while the load lock 52 may be used to cool. Ashing processes may also be provided for in the chambers. The substrate is then passed among the processing chambers 54A–54C. In each processing chamber, a specific semiconductor process may be performed on the substrate. Ashing or descumming may also occur in a processing chamber. More details of a multifunctional load lock may be found in above-mentioned U.S. patent application entitled "Multi-Function Chamber for a Substrate Processing System," now U.S. Pat. No. 6,086,362, issued on Jul. 11, 2000, and incorporated by reference above.

A processed substrate may be cooled in the cooling load lock chamber 52, which forms an exit load lock chamber, and may also be brought up to atmospheric pressure. Thereafter, the substrate may be removed from the system through the valve 62. Introduction and removal of substrates to and from the load lock chambers 50 and 52 may be performed by robots 64A and 64B, respectively (see FIG. 1). Alternatively, just one robot may be employed, operating on a track or conveyor, to introduce or remove substrates.

Each robot includes an end effector in the form of a lifting fork 66A, 66B at the distal end of an arm 68A, 68B. At its proximal end, each arm 68A, 68B is coupled to an associated vertical linear actuator (not shown) to permit the arm and lifting fork to be raised and lowered. Referring to FIGS. 2A and 2C, the top of the lifting forks 66A and 66B may have thereon a number of supports 154 to support a substrate 126 on top of the fork 66A, 66B.

The robot 64A, for instance, can retrieve and return substrates to and from substrate holding cassettes. In a first loading position, the robot 64A may load a substrate into heating load lock chamber 50 of the island through the gate or slit valve 60 (FIG. 3). Robot 64B operates in a similar fashion to robot 64A. In a first or lowered position, the fork 66A may be inserted beneath a substrate in a cassette or on a shuttle in a load lock chamber. The fork design is such that the same fork may be used for either, facilitating considerable advantage in incorporating the system into existing product lines. When raised to an intermediate position, the upper surface of the fork 66A or, more particularly, supports 154 (see FIGS. 2A and 2C) along the upper surface of the fork tines, engage the lower surface of the substrate. When further elevated to a second or raised position, the fork 66A lifts the substrate out of engagement with the cassette or shuttle.

During loading, a z-rotary actuator of the robot 64A is caused to rotate the loading end effector 66A 180° so that the substrate may be introduced into load lock heating chamber 50 through the slit valve 60. Fine adjustments may be made by the z-linear actuator to adjust the height of the substrate so that the substrate may enter through the slit valve 60 (FIG. 3) unimpeded. During substrate loading, the slit valve 60 is opened and the substrate is moved by a y-linear actuator in the y-direction. This movement loads the substrate into load lock heating chamber 50 where it is lowered onto the shuttle 70 using the z-linear actuator. The empty end effector 66A may then be withdrawn from the chamber. Slit valve 60 is then closed and the heating and evacuation process begun.

Associated with each load lock chamber 50 and 52 is a transfer shuttle 70 and 72, respectively, configured for transporting substrates between chambers. The first and second shuttles 70 and 72 are positioned in the heating and cooling load lock chambers during introduction of a substrate to the heating load lock chamber 50 and removal of a substrate from the cooling load lock chamber 52, respectively. Transfer shuttles 70 and 72 may be made of stainless steel, invar, ceramics or any other similar material. Invar may be preferable as it has a low coefficient of thermal expansion.

The load lock chambers 50 and 52 may be equipped with maintenance windows or slits 152 (FIG. 1). These windows 152 allow the removal of the components from the load locks for maintenance or repair. During such a maintenance situation, both shuttle and chamber components may be repaired.

Referring to FIGS. 1, 2B, 4, and 7D–7E, each shuttle 70, 72 has a first end 31A facing from the associated load lock chamber toward the adjacent processing chamber and a second end 31B opposite the first end. Each shuttle further has first and second sides 32A and 32B, respectively. The shuttles may be mirror images of each other and are positioned facing each other.

Referring specifically to FIG. 4, each shuttle includes first and second side rails 74A and 74B along the respective first and second sides of the shuttle. Both side rails extend substantially between the first and second ends of the shuttle. The side rails are parallel to and spaced-apart from each other. Each side rail includes a generally flat horizontal strip 75. Along an outboard portion of the underside of each strip, the rail bears a rack 76. An outboard portion 77 of the underside of each rack bears angled teeth 33 (the shape of the teeth are not shown). An inboard portion 78 of the underside of each rack is flat for engaging a number of guide rollers as described below. First and second cross-members 80A and 80B, respectively, proximate the first and second ends of the shuttle, structurally connect the first and second side rails to each other. Each cross-member is slightly recessed from the associated end of the shuttle, and each cross-member includes a flat central horizontally-extending strip 82. First (83A and 84A) and second (83B and 84B) legs depend from first and second ends of the strip and connect such ends to the first and second side rails, respectively.

An "X" indicates the location of the center of the substrate. This X location should roughly correspond with the center of the processing chamber, as measured in a horizontal plane, for optimum processing of the substrate.

Substrate support fingers 86A, 88A, 86B and 88B extend inwardly from the associated first and second side rails, respectively. Referring to FIGS. 4 and 5, each support finger has a proximal portion 90 extending upwardly from the associated side rail 75 and a distal portion 92 extending horizontally inwardly from the proximal portion and ending at a tip. At the tip, the upper surface of each finger bears a pad 94 for supporting a substrate held by the shuttle. As the shuttle must endure the temperatures used for heating substrates, to temperatures of about 460° C. or even higher, the pads 94 may advantageously be made of a material such as a ceramic, stainless steel, quartz, or other such materials. It should be noted, however, that the temperature requirements of the substrate transfer shuttle components may be lower than in prior systems. In many prior systems, such as cluster tools, substrates would be removed from a heating chamber by a vacuum robot which would then transport the substrate to a processing chamber, resulting in cooling of the substrate. A solution was to overheat the substrate, intending for it to cool when transported.

In the present invention, the substrate transfer shuttle 70 moves the substrate into a processing chamber directly from the heating chamber. Thus, the requirement for overheating the substrate is alleviated if not eliminated.

FIG. 5 also shows inner and outer chamber walls 38B and 38A, respectively. A slot 38C is located in inner wall 38B to allow the flat rail 75 of the shuttle to extend into the opening in wall 38B to engage rollers 98. In this way, contamination caused by guide rollers 98 may be minimized. Further, the process performed within the chamber is kept separate from the mechanical components causing the shuttle movement.

The width of the lifting forks 66A, 66B may be close to but less than the distance between the two exterior support fingers 88A and 88B along one side of the shuttle 70. The central cut-out section of the fork should be large enough such that it does not interfere with the central support finger 86A. In the embodiment of FIGS. 2B–2C and 7E, where diagonal support fingers are employed, the width of the fork may be larger.

In the illustrated preferred embodiment of FIGS. 2B–2C and 7E, there are three support fingers associated with each side rail: a central support finger 86A, 86B and two lateral diagonal support fingers 88A, 88B. Each support finger preferably extends about 15–30% of a dimension such as the length or the diagonal of the substrate in order to adequately support the substrate, and even more preferably about 22% of the length approximately (0.22 l) of the substrate. Referring to FIG. 2D, such placement ensures that when a substrate 126 is heated, bowing caused by the substrate flexibility results in a minimal volume swept out by the bowing substrate as it moves along the flow path. In particular, by constructing the fingers 86A, 86B, 88A, and 88B and pads 94 in this configuration, where the pads are located at about the 22% point, a minimal volume is swept out by the bowing substrate as it is moved from one processing chamber to another, or between a processing chamber and a load lock. Thus, the chance of such a substrate striking, e.g., a platen or a susceptor, is substantially reduced. This consideration is particularly important for glass substrates on which TFT's are formed for flat panel displays, as these may be only about 0.7–1 mm thick.

The height of pads 94 is also important. The height should be chosen such that when the heated substrate bows, the edges of the substrate do not make contact with the fingers directly. The importance of this aspect to the quality of the resulting substrate depends on the process requirements.

Another advantage of such a configuration is that the same support fingers may be used to support several different sizes of substrates. Moreover, the location of the support fingers is adjustable to accommodate various substrate sizes. The location of the pads 94 is also variable to accommodate different substrate sizes. It should also be noted that while a shuttle servicing the load lock chamber 50 must be designed to withstand high temperatures, the shuttle servicing load lock chamber 52 has somewhat more forgiving requirements, as it is less inclined to see the maximum processing temperatures.

FIGS. 1, 4, and 7D show an alternate embodiment in which lateral support fingers 88A and 88B are not diagonal but rather are parallel to support fingers 86A and 86B. Other angled fingers may be used, so long as they adequately support the substrate.

The above designs allow each shuttle to accept substrates from two directions, each 90° away from each other. First, the shuttle may accept and release substrates in a direction perpendicular to the side rails. Second, the shuttle may accept and release substrates in a direction parallel to the side rails. In any of the embodiments, a plurality of stoppers 201 may be provided, as shown in FIGS. 2B–2C, 4–5 and 8A–8B, to ensure accurate placement of the substrate on the support fingers and to prevent accidental shifting of the substrate on the shuttle during transport. Substrates may also be centered on the fingers by using the plurality of stoppers 201. These stoppers 201 may have the general shape of an inverted truncated cone, such as an inverted frustum.

Along each side of the island (FIGS. 1, 3, 5, and 7A–7C), each load lock chamber and each processing chamber includes a number of pairs of guide rollers 98 (e.g., two rollers per side of the processing chambers and three rollers per side of the load locks) positioned so as to provide support and guidance to one or both shuttle(s) as such shuttle(s) pass through the chambers. The guide rollers 98 may be Teflon®-coated aluminum, Vespel®, or any other such material that is not particulate-generating and is soft for dampening vibrations. Alternatively, suspensions may be employed to provide a smooth movement. The guide rollers are all at substantially even level and define a fixed path along which the shuttles may move back and forth. The guide rollers are configured to engage the flat inboard portion 78 of the underside of each rack as a shuttle passes over the guide rollers so as to position and orient the shuttle and provide smooth shuttle movement along the predefined path.

As shown in FIG. 3, between each of the processing chambers 54A–54C and the load lock chambers are chamber isolation valves whose housings may each include a shuttle drive mechanism 100. Such a configuration reduces particulate contamination within the processing chambers as is often required, e.g., in TFT formation. Such an island layout also facilitates a high degree of modularity because each chamber has a similar structure and is interchangeable. With one drive mechanism within the housing of each isolation valve, the length of the shuttles used is generally longer, as described in more detail below, than the associated distance between the driving mechanisms. Moreover, the overall length of the shuttles used is generally longer than the length of any process chambers through which they pass.

As shown in FIG. 6A, each drive mechanism 100 includes a motor 102 external to the interior cavity of the associated chamber and coupled to a drive shaft assembly 104 extending into and within the interior of the load lock or valve housing. The inner chamber wall 38B is not shown for clarity. The drive shaft assembly 104 may employ vacuum-compatible rotary feedthroughs. The drive shaft assembly carries first and second pinion gears 106A and 106B adjacent first and second sides of the associated chamber, and first and second guide rollers 108A and 108B immediately inboard of the first and second pinion gears, respectively. The pinion gears are configured to mesh with the toothed outboard portions 33 of the racks while the guide rollers are configured to contact the smooth surface of the inboard portion of the racks of a shuttle passing over the drive mechanism (see also FIGS. 4 and 5). Optionally, the drive mechanism 100 includes an encoder 110 which provides input to a control system 111 responsive to rotation of the associated drive shaft assembly. The control system 111 may be connected to any and each of the various chambers for controlling their operations as well as the operation of any handling or processing equipment external to the island. The control system may comprise a user-programmable computer or other controller incorporating appropriate software or firmware.

FIG. 6B shows an alternate configuration in which no drive shaft is employed. In this configuration, the shuttle is driven from one side only, and the motor may drive a pinion gear 106 without using the drive shaft assembly 104. Laterally positioned guide rollers 203 may be used in addition to guide roller 108A and 108B to ensure that the shuttle moves in a straight horizontal direction and is not caused to misalign due to its only being driven on one side. Rollers 203 are positioned on each side of a guide rail 112 in order to keep the shuttle 70 moving in a straight and controlled direction.

In either of these embodiments, it should be noted that it is not crucial that the guide rollers be inboard of the pinion gears. In fact, in an alternative embodiment, the guide rollers may be outboard of the pinion gears or the relative position may be different on each side of a line of chambers. In yet another embodiment, rollers may be placed on the substrate transfer shuttle and a smooth flat ridge may be located along each side of a line of chambers to support the shuttle guide rollers.

In the following discussion, the placement of a substrate into a load lock chamber is described with respect to FIGS. 7A–7E. In the discussion of FIGS. 7A–7E, the support on which the substrate is placed is referred to as a platen. The platen has slots through which fingers of the shuttle may move when transferring substrates. The placement of a substrate into a process chamber from a load lock chamber is described with respect to FIGS. 8A–8B. In the discussion of FIGS. 8A–8B, the support on which the substrate is placed is referred to as a susceptor. The susceptor has passages with extendable "T"-shaped pins for use in transferring substrates, as described below. It should be noted that the above definitions for platen and susceptor are used herein for clarity. The susceptor in the processing chamber may be equally well termed a "platen" and the platen in the load lock may be equally well termed a "susceptor."

As shown in FIGS. 7A–7C, each load lock chamber 50, 52 (only chamber 50 is shown) includes a platen 120 for supporting a substrate during heating or cooling prior to or after processing. A pedestal 122 supports the platen 120 and is raisable and lowerable to raise and lower the platen 120 between a first or retracted position and a second or extended position. The platen 120 is generally rectangular and slightly larger than the plan area of the substrate and has a plurality of channels 124 (FIGS. 7D and 7E) extending inwardly from the opposite sides of the platen. The channels are configured so as to accommodate the fingers 86A, 86B, 88A, and 88B of a shuttle 70 when the platen 120 is raised or lowered through such a shuttle 70 as described below.

Initially, the load lock chamber 50 is vacant and is shielded from the adjacent chamber 54A by the valve 56A. The load lock chamber 50 is vented to atmosphere and its slit valve 60 is opened to permit introduction of a substrate to the island. As shown in FIG. 7A, a substrate 126 is loaded into the load lock chamber 50 by the robot end effector 66A. The end effector and substrate are inserted via a horizontal (y-direction) movement into the chamber 50 at a height at which the underside of the end effector 66A is above the fingers 88A, 88B of the shuttle 70. The end effector 66A carrying the substrate 126 is stopped with the substrate 126 located centrally above the platen and then lowered. Eventually, the end effector 66A reaches a second height shown in FIG. 7B. During movement between the first height and the second height, the end effector passes below the fingers of the shuttle, with e.g., one tine of the end effector 66A passing on each side of the central fingers 86A and 86B and just inboard of adjacent lateral support fingers 88A, 88B. When the upper surface of the end effector 66A reaches the height of the pads 94 at the tip of the fingers, the pads 94 will engage the underside of the substrate 126 causing the shuttle 70 to acquire the substrate 126 from the end effector 66A. When the end effector 66A reaches the position shown in FIG. 7B, it may be withdrawn from the load lock chamber 50 via horizontal translation. Once the end effector 66A is withdrawn, the valve 60 may be closed and the chamber 50 pumped down.

The platen 120 may then be raised from its initial height in FIG. 7A to a raised height shown in FIG. 7C. During movement between the initial height and the raised height, the platen 120 passes around the fingers of the shuttle, each finger being accommodated by an associated one of the channels 124 (see FIGS. 7D and 7E). When the upper surface of the platen 120 contacts the underside of the substrate 126, it raises the substrate 126 off of the fingers (more particularly, pads 94) to acquire the substrate 126 from the shuttle 70. With the substrate 126 held by the platen 120 as shown in FIG. 7C, the substrate 126 may be heated or otherwise prepared to ready it for processing.

A multiple substrate cassette (not shown) may also be employed in the load lock chambers 50 or 52. By repeating the above procedure for each substrate in a multiple substrate cassette, the load lock chamber 50 may be used as a buffer for storage of substrates prior to processing. More details of a multiple substrate cassette are provided in above-mentioned U.S. patent application for an "In-Situ Substrate Transfer Shuttle," U.S. Ser. No. 09/082,488, filed on May 20, 1998, and incorporated by reference above.

Once the substrate 126 is heated, the platen 120 may be lowered and returned to the position of FIG. 7B, with the shuttle 70 reacquiring the substrate 126 from the platen 120 in the process.

With a substrate 126 supported on the shuttle 70 in the load lock chamber 50, after any heating of the substrate 126 and pump down of the load lock chamber 50 and of the first processing chamber 54A, the valve 56A may be opened to establish communication between the load lock chamber 50 and the processing chamber 54A. With the shuttle in this initial position, the pinion gears of the drive mechanism 100 of the load lock 50 are engaged to the racks of the shuttle 70 adjacent the downstream ends of the shuttle's rails. To move the substrate into the processing chamber, the motor of the drive mechanism may be powered so as to move the shuttle downstream through the valve 56A and into the first processing chamber. When the shuttle reaches a target position in the first processing chamber 54A, its movement is stopped, leaving the shuttle and substrate in the target position.

As shown in FIGS. 8A–8B, each processing chamber includes a susceptor 130 for supporting a substrate 126 during processing. The plan area of the susceptor 130 is slightly larger than that of the substrate 126 and the susceptor 130 has an upper surface 132 configured to contact substantially the entire underside of the substrate 126 during processing. The upper surface 132 of the susceptor 130 is continuous except for interruptions caused by the presence of passages for the lift pins 134 which may extend through the susceptor 130 from below. As illustrated, the susceptor 130 has a central pedestal 136 which may be raised and lowered to raise and lower the susceptor 130. The lift pins 134 are secured at their lower ends to a pin plate 138. The pins and pin plate are generally raised and lowered by an outer shaft 139 which surrounds the central pedestal 136. In one embodiment, lift pins 134 and pin plate 138 move independently from susceptor 130. Lift pins 134 support a substrate when they are in an extended position. As the lift pins are retracted, the substrate is lowered onto the susceptor 130. When susceptor 130 is caused to rise, the lift pins are caused to retract to a position below the surface 132 of the susceptor 130. The pins may pass below surface 132 by virtue of a counterbore located within surface 132.

This embodiment allows a convenient way of transferring support of the substrate from the pins 134 to the susceptor 130 as the susceptor 130 is raised. More details of this pin system may be found in U.S. patent application Ser. No. 08/950,277, entitled "A Vacuum Processing System Having Improved Substrate Heating and Cooling", filed Oct. 14, 1997, assigned to the assignee of the present invention and incorporated herein by reference.

In the illustrated embodiment, each chamber includes six lift pins 134 arranged in pairs extending from upstream to downstream in the chamber. Like the support fingers and for the same reasons, the lift pins 134 may also be advantageously located at about 15–30% of the dimension of the substrate 126 and more preferably about 22% of the width of the substrate 126. They may even more preferably be located just inside of the distal end of the pad 94 location. While it would be preferable to have both the pins 134 and the pads 94 at the 22% point, such placement would not allow the same to pass around each other. Thus, it may be advantageous to have the pins and pads close to each other, but to have the pins just nearer to the centerline of the substrate that the pads. In this way, relative movement can be accomplished without contact.

The lift pins 134 may have the general cross-sectional shape of a "T". A corresponding counterbore, as mentioned above, may be placed in the susceptor 130 around the lift pin holes so that the lift pins, when fully retracted, are below the level of the top surface 132 of the susceptor 130. The substrate then does not contact the lift pins in their retracted positions. In this way, the lift pins have a minimal thermal signature. In other words, the lift pins 134, and their passages through the susceptor 130, do not significantly affect the even distribution of temperature across the susceptor 130 and thus across the substrate 126. Thus, the high process requirements with regard to uniformity of temperature for, e.g., TFT formation may be advantageously achieved.

When the shuttle 70 carrying the substrate 126 enters the processing chamber 54A, the substrate 126 and shuttle fingers 86A, 86B, 88A, and 88B pass over the susceptor 130 which is at a first height as shown in FIG. 8A. The lift pins 134 may be in an extended position relative to the susceptor 130 (as shown in FIGS. 8A and 8B) or may be in a retracted position. When the substrate 126 and shuttle 70 are stopped in a target position immediately above the susceptor 130, the susceptor 130 and/or lift pins 134 are raised. As lift pin plate 138, lift pins 134, and/or the susceptor 130 are raised, the pins (stationary and in the extended position) contact the underside of the substrate 126 (FIG. 8A) and raise the substrate 126 out of the engagement with the shuttle 70 (FIG. 8B). With the substrate 126 in this intermediate position, the shuttle 70 may be withdrawn from the processing chamber 54A, with the fingers 86A, 86B, 88A, and 88B passing around the lift pins 134 and between the substrate 126 and the susceptor 130, at least one of the cross members 80A, 80B of the shuttle 70 passing over the substrate 126. The shuttle 70 may be withdrawn to the load lock chamber 50 or may be driven into the second processing chamber 54B or therebeyond, e.g., to service other substrates by transporting the same to other chambers, etc. Once, however, the shuttle 70 is out of the chamber 54A, the chamber 54A may be sealed by shutting the valve 56A (and valves 58A and 56B if these have been opened). The pins 134 may then be lowered relative to the susceptor 130 to place the substrate atop the susceptor 130.

At this point, processing may begin. When processing is complete and any process gases evacuated (if necessary), the valve 56A may be opened, establishing communication between the load lock chamber 50 and the processing chamber 54A. Of course, valves 58A and 56B may also be opened if the shuttle has been sent downstream. The lift pins 134 and pin plate 138 may then be raised, thus raising the substrate above the susceptor 130 such that the substrate is supported on the lift pins. The shuttle 70 is returned to the processing chamber 54A in a similar fashion as when delivering the substrate 126 to the processing chamber 54A. As the shuttle approaches a target position, the fingers 86A, 86B, 88A, and 88B pass between the substrate 126 and the susceptor 130, passing around the lift pins 134. The cross-member 80A passes over the substrate 126. When the shuttle 70 reaches the target position, the susceptor 130 and/or pins 134 may be lowered to the position of FIG. 8A, during which the fingers 86A, 86B, 88A, and 88B acquire the substrate 126 from the pins 134.

Next, the substrate 126 may be delivered to the second processing chamber 54B through valves 58A and 56B. The steps of this transfer may be similar to the steps involved in the transfer from the load lock chamber 50 to the first processing chamber 54A. Via a similar process, the substrate 126 may be transferred to the third processing chamber 54C. This may be done with either of the shuttles 70 and 72. Finally, the substrate may be withdrawn from the third processing chamber 54C into the load lock chamber 52 by the shuttle 72 via a reverse of steps similar to those performed with the shuttle 70 in transferring the substrate from the load lock chamber 50 to the first processing chamber 54A. Similarly, the extraction of the substrate 126 from the cooling load lock chamber 52 by the robot end effector 68B may be performed by substantially reversing the steps used with the robot end effector 66A in introducing the substrate 126 to the heating load lock chamber 50.

The use of such lift pins 134 provides another advantage. In any of the chambers, lift pins 134 may be used to elevate the substrate 126 above the heated or cooled susceptor 130. Such elevation may be maintained for as long as necessary to bring the substrate temperature to a desired level. For example, if the substrate 126 is to be cooled, but the susceptor 130 is at a high temperature, maintaining the pins 134 in an elevated position may be useful for cooling the substrate 126.

As shown in FIGS. 1 and 1A, alcoves or compartments 148 in the end walls of the entrance and exit load locks are provided to accommodate an associated end of a side rail of the shuttles 70 and 72, respectively. When the shuttle is in the target position in a load lock chamber, the side rail's ends are received and accommodated by such compartments. As noted above, the rails may be generally longer than the length of process chambers 54A–54C. This allows the volume of the load locks to be correspondingly minimized. Such minimization is advantageous for, e.g., accomplishing a more convenient pump-down.

For a variety of reasons, it may be advantageous to attempt to minimize chamber volume. Reduced chamber volume facilitates faster and more economical pumping down of chambers, including reducing the capacity requirements for any vacuum pumps. Additionally, the introduction of process or inert gases is facilitated with a reduced consumption of such gases. Heating and cooling may be more easily facilitated. Process uniformity may be increased, for example, by providing a more uniform plasma in the absence of voids or cavities.

With respect to the process of chambers 54A–54C, an additional benefit of providing each chamber with two valves 56A–56C, 58A–58C is that this allows each such valve to be located substantially adjacent the susceptor of the associated chamber. An even more important benefit is that the drive mechanism 100 of each processing chamber may be located in the outside of the cavity defined by the valve housing. This significantly reduces contamination of the chambers due to the drive mechanisms.

Advantageously, the system is configured so that certain components may be serviced or replaced with minimal disruption of the system or contamination of the system chambers. As illustrated in FIGS. 6A and 6B, the drive motors 102 and encoders 110 may be serviced or replaced from outside the island without risk of contamination. If a drive shaft 104 or any of its associated components needs to be serviced or replaced, such operation may be performed with the valves on either side of the drive mechanism closed. Thus, the interiors of the adjacent chambers will not become contaminated from such action. Any contamination will be limited to the space between the valves immediately surrounding the drive mechanism which may be more readily cleaned than the interior of the adjacent chambers.

A number of embodiments of the present invention have been described. Nevertheless, it will be understood that various modifications may be made without departing from the spirit and scope of the invention. For example, the particular processes associated with fabricating a given device may advantageously be associated with different chamber arrangements and sequences of use. In this way, the types of chambers may be those employed in etching processes, physical vapor deposition, chemical vapor deposition, etc. In another modification, while three process chambers have been described here, the system may employ a single process chamber, two process chambers, or more than three process chambers. The system of the present invention, as it is modular and incremental, allows numerous modifications to suit any particular process. For example, the shuttle of the present invention may be controlled to even repeat processing steps for a particular substrate if desired. In this way, the shuttle may be controlled to be bidirectional. Accordingly, other embodiments are within the scope of the following claims.

What is claimed is:

1. A system for processing a substrate, comprising:
a first chamber;
a second chamber coupled to the first chamber and configured to perform a process on the substrate;
a valve to selectively seal the first chamber from the second chamber when closed and to permit transfer of the substrate between the first chamber and the second chamber through the valve when open;
a substrate transfer shuttle moveable along a linear path, defined by guide rollers, between one position in the first chamber and another position in the second chamber to transfer the substrate between the first chamber and the second chamber, and further moveable along the linear path between the another position in the second chamber and the one position in the first chamber to transfer the substrate between the second chamber and the first chamber, the shuttle having one or more substrate support fingers disposed thereon; and
a substrate support disposed in the second chamber and adapted to move from a lower position to a higher position, wherein at least a portion of the substrate support moves between the substrate support fingers of the shuttle.

2. An apparatus for processing a substrate, comprising:
a load lock chamber for introduction of the substrate;
a processing chamber coupled to the load lock chamber and configured to perform a process on the substrate, said processing chamber having a susceptor for supporting the substrate during the process, the susceptor movable between lowered, intermediate, and raised positions, wherein the susceptor in the processing chamber includes a plurality of lift pins which are movable through holes in the susceptor and which support the substrate above the susceptor in the intermediate and raised positions;

a valve to selectively seal the load lock chamber from the processing chamber when closed and to permit transfer of the substrate between the load lock chamber and the processing chamber through the valve when open;

a substrate transfer shuttle moveable along a shuttle path between one position in the load lock chamber and another position in the processing chamber to transfer the substrate between the load lock chamber and the processing chamber, the substrate transfer shuttle configured and arranged so that when in said another position, the substrate may be removed from the substrate transfer shuttle by moving the susceptor from the lowered position to the intermediate position, after which the substrate transfer shuttle may be removed from the processing chamber, the shuttle having one or more substrate support fingers disposed thereon, wherein at least a portion of the susceptor is adapted to move between the substrate support fingers of the shuttle, wherein the substrate transfer shuttle includes:

first and second longitudinal side rails at respective first and second sides thereof;

a first plurality of the substrate support elements extending inwardly from the first longitudinal side rail and positioned to pass below the substrate when the substrate transfer shuttle is removed from the processing chamber; and a second plurality of the substrate support elements extending inwardly from the second longitudinal side rail and positioned to pass below the substrate when the substrate transfer shuttle is removed from the processing chamber.

3. The apparatus of claim 2, wherein the lift pins are adjacent respective ones of the substrate support elements.

4. The apparatus of claim 3, wherein said lift pins are nearer to a centerline of the substrate than the pluralities of substrate support elements.

5. The apparatus of claim 2, further including a plurality of pads located on said pluralities of substrate support elements to support the substrate above said substrate support elements.

6. The apparatus of claim 5, wherein said pads are sufficiently high such that bowing of a heated substrate does not result in the substrate directly contacting the substrate support elements.

7. The apparatus of claim 2, further comprising a plurality of stoppers located on said pluralities of substrate support elements to secure the substrate against lateral movement.

8. The apparatus of claim 2, further including a first cross member structurally connecting the first and second longitudinal side rails.

9. The apparatus of claim 8, further including a second cross-member structurally connecting the first and second longitudinal side rails and having an underside, the underside positioned to pass over the susceptor when the substrate transfer shuttle is introduced into or removed from the processing chamber.

10. The apparatus of claim 9, wherein at least the first longitudinal side rail has a portion extending beyond the second cross-member and accommodated within an associated alcove in the load lock chamber when the substrate transfer shuttle is in the one position.

11. The apparatus of claim 6, wherein the second longitudinal side rail has a portion extending beyond the second cross-member and accommodated within an associated alcove in the load lock chamber when the substrate transfer shuttle is in the one position.

12. The apparatus of claim 8, wherein the first cross-member has an underside positioned to pass over the susceptor when the substrate transfer shuttle is removed from the processing chamber.

13. The apparatus of claim 2, wherein said substrate support elements extend about 15–30% of a dimension of the substrate.

14. The apparatus of claim 13, wherein said substrate support elements extend about 22% of a dimension of the substrate.

15. The apparatus of claim 2, further including a first drive mechanism engageable with at least the first longitudinal side rail to move the substrate transfer shuttle along at least a first portion of the shuttle path.

16. The apparatus of claim 15, further including a second drive mechanism engageable with at least the first longitudinal side rail to move the substrate transfer shuttle along at least a second portion of the shuttle path.

17. The apparatus of claim 15, wherein the first longitudinal side rail includes a mechanical drive element.

18. The apparatus of claim 17, wherein said mechanical drive element is a toothed rack.

19. The apparatus of claim 15, wherein the first drive mechanism is engageable with both the first and second longitudinal side rails.

20. The apparatus of claim 2, wherein the substrate support elements, extending inwardly from the first longitudinal side rail, each have a proximal portion extending at least in part upwardly from the first rail and have a distal portion extending inwardly from the proximal portion so that when the substrate transfer shuttle is supporting a substrate, an end effector may be accommodated vertically between the substrate and the first longitudinal side rail and laterally between at least some of the substrate support elements extending inwardly from the first longitudinal side rail.

21. The apparatus of claim 2, wherein the processing chamber includes a susceptor support depending from the susceptor, the susceptor support movable to raise and lower the susceptor and wherein at least a group of the first and second pluralities of substrate support elements are positioned to pass alongside the susceptor support when the substrate transfer shuttle is withdrawn along the shuttle path.

22. An apparatus for performing a process on a substrate, comprising:

a load lock chamber for introduction of the substrate;

a first processing chamber coupled to the load lock chamber and configured to perform a process on the substrate, the first processing chamber including a first susceptor to support the substrate during performance of the process and the first susceptor being movable between lowered, intermediate, and raised positions;

a valve to selective seal the load lock chamber from the first processing chamber when closed and to permit transfer of the substrate between the load lock chamber and the first processing chamber when open;

a substrate transfer shuttle supported on a track by rails extending from the shuttle and moveable along a linear shuttle path between one position in the load lock chamber and a second position in the first processing chamber to transfer the substrate between the load lock chamber and the first processing chamber, the substrate transfer shuttle configured and arranged so that when in said second position, the substrate may be removed from the substrate transfer shuttle by moving at least a portion of the susceptor from the lowered position to the intermediate position, after which the substrate transfer shuttle may be removed from the processing chamber;

a second processing chamber coupled to the first processing chamber and configured to perform a process on the substrate, the second processing chamber including a second susceptor to support the substrate during performance of the process and the second susceptor being movable between lowered, intermediate, and raised positions;

a second valve to selectively seal the second processing chamber from the first processing chamber when closed and to permit transfer of the substrate between the second processing chamber and the first processing chamber when open; and wherein the substrate transfer shuttle is further moveable along a linear shuttle path between the second position and a third position in the second processing chamber to transfer a substrate between the first processing chamber and the second processing chamber, the substrate transfer shuttle configured and arranged so that a substrate thereon in the third position may be removed by moving the susceptor of the second processing chamber from the lowered position to the intermediate position, after which the substrate transfer shuttle may be withdrawn from the second processing chamber.

23. An apparatus for performing a process on a substrate, comprising:

a first chamber having a mechanism to support the substrate therein, the mechanism movable between retracted and extended positions;

a second chamber coupled to the first chamber;

a valve to selectively seal the first chamber from the second chamber when closed and to permit transfer of the substrate through the valve when open;

a substrate transfer shuttle supported on a track by rails extending from the shuttle and moveable along a linear path which extends at least between one position in the first chamber and another position in the second chamber to transfer the substrate between the first chamber and the second chamber, the substrate transfer shuttle configured and arranged so that a substrate in the one position may be removed from the substrate transfer shuttle by moving the support mechanism to the extended position after which the substrate transfer shuttle may be removed from the first chamber.

24. The apparatus of claim 23, wherein said second chamber further includes a mechanism to support the substrate therein, the mechanism movable between retracted and extended positions, so that a substrate in the another position may be removed from the substrate transfer shuttle by moving at least a portion of the support mechanism to the extended position after which the substrate transfer shuttle may be removed from the second chamber.

25. An apparatus for performing a process on a substrate, comprising:

a first chamber having a mechanism to support the substrate therein, the mechanism movable between retracted and extended positions;

a second chamber coupled to the first chamber and having a mechanism to support the substrate therein, the mechanism movable between retracted and extended positions;

a first valve to selectively seal the first chamber from the second chamber when closed and to permit transfer of the substrate through the first valve when open;

a third chamber coupled to the second chamber and having a mechanism to support the substrate therein, the mechanism movable between retracted and extended positions;

a second valve to selectively seal the second chamber from the third chamber when closed and to permit transfer of the substrate through the second valve when open;

two substrate transfer shuttles, each moveable along a linear path which extends at least between one position in the first chamber and another position in the third chamber to transfer the substrate between the first chamber, the second chamber, and the third chamber, one of the substrate transfer shuttles to transfer substrates between the first chamber and the second chamber, the other of the substrate transfer shuttles to transfer substrates between the second chamber and the third chamber, said substrate transfer shuttles configured and arranged so that when in a selected one of the chambers, the substrate may be removed from the substrate transfer shuttle by moving the support mechanism to the extended position after which the substrate transfer shuttle may be removed from the selected one of the chambers; the shuttles each having one or more substrate support fingers disposed thereon, at least a portion of one or more of the mechanisms disposed in the chambers being adapted to move between the substrate support fingers of the shuttle.

26. An apparatus for performing a process on a substrate, comprising:

a first load lock chamber;

a first load lock valve to selectively seal the first load lock chamber from the first chamber when closed and to permit transfer of the substrate through the first load lock valve when open;

a first chamber coupled to said first load lock chamber and having a mechanism to support the substrate therein, the mechanism movable between retracted and extended positions;

a second chamber coupled to the first chamber and having a mechanism to support the substrate therein, the mechanism movable between retracted and extended positions;

a first valve to selectively seal the first chamber from the second chamber when closed and to permit transfer of the substrate through the first valve when open;

a third chamber coupled to the second chamber and having a mechanism to support the substrate therein, the mechanism movable between retracted and extended positions;

a second valve to selectively seal the second chamber from the third chamber when closed and to permit transfer of the substrate through the second valve when open;

a second load lock chamber;

a second load lock valve to selectively seal the second load lock chamber from the third chamber when closed and to permit transfer of the substrate through the second load lock valve when open;

two substrate transfer shuttles, each shuttle supported on a track by rails extending from the shuttle and moveable along a linear path which extends at least between one position in the first load lock chamber and another position in the second load lock chamber to transfer the substrate between the first load lock chamber, the first chamber, the second chamber, the third chamber, and the second load lock chamber, one of the substrate transfer shuttles to transfer substrates between the first load lock chamber, the first chamber and the second chamber, the other of the substrate transfer shuttles to transfer substrates between the second chamber, the third chamber and the second load lock chamber, said substrate transfer shuttles configured and arranged so that when in a selected one of the chambers, the substrate may be removed from the substrate transfer shuttle by moving the support mechanism from the retracted position to the extended position after which the substrate transfer shuttle may be removed from the selected one of the chambers.

27. An apparatus for processing a substrate, comprising:
a first load lock chamber for introduction of the substrate;
a second load lock chamber for removal of the substrate;
at least one intermediate chamber located between the first and second load lock chambers, said intermediate chamber configured to perform a process on a substrate;
a first valve to selectively seal the first load lock chamber from the intermediate chamber;
a second valve to selectively seal the second load lock chamber from the intermediate chamber;
a substrate transfer shuttle supported on a track by rails extending from the shuttle and moveable along a linear path defined by guide rollers between one position external to the intermediate chamber and another position in the intermediate chamber to transfer a substrate to the intermediate chamber, the substrate transfer shuttle configured and arranged so that a substrate in the intermediate chamber may be removed from the substrate transfer shuttle after which the substrate transfer shuttle may be removed from the intermediate chamber.

28. The apparatus of claim 27, further including a plurality of intermediate chambers located between the first load lock chamber and the second load lock chamber.

29. The apparatus of claim 28, further including two substrate transfer shuttles, a first one of said substrate transfer shuttles moveable along a first shuttle path between the first load lock chamber and the intermediate chamber and a second one of said substrate transfer shuttles moveable along a second shuttle path between the second load lock chamber and the intermediate chamber.

30. A system for processing a substrate, comprising:
a first chamber;
a second chamber coupled to the first chamber and configured to perform a process on a substrate;
a valve to selectively seal the first chamber from the second chamber when closed and to permit transfer of the substrate between the first chamber and the second chamber through the valve when open;
a support mechanism disposed in at least one of the chambers and movable between retracted and extended positions;
a substrate transfer shuttle supported on a track by rails extending from the shuttle and moveable along a linear path between one position in the first chamber and another position in the second chamber to transfer the substrate between the first chamber and the second chamber; the substrate transfer shuttle configured and arranged so that a substrate may be removed from the substrate transfer shuttle by moving at least a portion of the support mechanism to the extended position after which the substrate transfer shuttle may be removed from the respective chamber; and
a drive mechanism engageable with the substrate transfer shuttle to move the substrate transfer shuttle along at least a portion of the linear path.

31. A substrate transfer shuttle for carrying a substrate in a processing system having at least two chambers, the shuttle comprising:
a) first and second longitudinal side rails;
b) cross members proximate first and second ends of the first and second longitudinal side rails to structurally connect the first and second longitudinal side rails;
c) a first plurality of substrate support elements extending inwardly from the first longitudinal side rail; and
d) a second plurality of substrate support elements extending inwardly from the second longitudinal side rail;
wherein the shuttle has one or more substrate support finders disposed thereon, the substrate transfer shuttle being moveable along a shuttle path between one position in a load lock chamber of the processing system and another position in a processing chamber of the processing system to transfer the substrate between the load lock chamber and the processing chamber, the substrate transfer shuttle configured and arranged so that when in said another position, the substrate may be removed from the substrate transfer shuttle by moving at least a portion of a susceptor from a lowered position to an intermediate position between the substrate support fingers of the shuttle, after which the substrate transfer shuttle may be removed from the processing chamber.

32. The apparatus of claim 31, wherein said substrate support elements extend about 15–30% of a dimension of the substrate.

33. The apparatus of claim 32, wherein said substrate support elements extend about 22% of a dimension of the substrate.

34. The apparatus of claim 31, wherein the first and second longitudinal side rails each include a toothed rack mounted on the underside thereof.

35. The apparatus of claim 31, wherein the substrate support elements, extending inwardly from the first and second longitudinal side rails, each have a proximal portion extending at least in part upwardly from the first longitudinal side rails and a distal portion extending horizontally inwardly from the proximal portion so that when the substrate transfer shuttle is supporting a substrate, an end effector may be accommodated vertically between the substrate and the first longitudinal side rail and laterally between at least some of the proximal portions of the substrate support elements.

36. The apparatus of claim 31, wherein at least the first longitudinal side rail has a portion extending beyond the second cross-member.

37. The apparatus of claim 31, wherein the distal portions of the substrate support elements are parallel.

38. The apparatus of claim 31, wherein at least one of the distal portions of the substrate support elements is at an angle with respect to at least another of the distal portions of the substrate support elements.

* * * * *

UNITED STATES PATENT AND TRADEMARK OFFICE
CERTIFICATE OF CORRECTION

PATENT NO.     : 6,517,303 B1                                               Page 1 of 1
DATED          : February 11, 2003
INVENTOR(S)    : White et al.

It is certified that error appears in the above-identified patent and that said Letters Patent is hereby corrected as shown below:

Column 20,
Line 23, please change "finders" to -- fingers --.

Signed and Sealed this

Sixth Day of January, 2004

JAMES E. ROGAN
*Director of the United States Patent and Trademark Office*